(12) United States Patent
Vitzilaios et al.

(10) Patent No.: US 7,489,192 B2
(45) Date of Patent: Feb. 10, 2009

(54) LOW-NOISE AMPLIFIERS (75) Inventors: Georgios Vitzilaios, Galatsi (GR); Yannis Papananos, Vrilissia (GR)

(73) Assignee: Theta Microelectronics, Inc., Los Altos, CA (US)

( * ) Notice: Subject to any disclaimer, the term of this patent is extended or adjusted under 35 U.S.C. 154(b) by 78 days.

(21) Appl. No.: 11/803,509

(22) Filed: May 14, 2007

(65) Prior Publication Data
US 2007/0290745 A1 Dec. 20, 2007

Related U.S. Application Data

(60) Provisional application No. 60/802,106, filed on May 22, 2006.

(51) Int. Cl.
*H03F 1/36* (2006.01)
(52) U.S. Cl. .......................................... 330/79; 330/283
(58) Field of Classification Search ................. 330/283, 330/79, 294, 104, 292
See application file for complete search history.

(56) References Cited

U.S. PATENT DOCUMENTS

| | | | |
|---|---|---|---|
| 6,259,325 B1 * | 7/2001 | Ishizuka et al. ............. 330/301 |
| 6,681,103 B1 | 1/2004 | Rogers et al. |
| 6,809,581 B2 | 10/2004 | Rofougaran et al. |
| 7,110,742 B2 | 9/2006 | Roufoogaran |
| 7,167,044 B2 | 1/2007 | Li et al. |
| 7,205,844 B2 | 4/2007 | Su et al. |
| 7,339,436 B2 * | 3/2008 | Fu et al. ..................... 330/294 |
| 7,355,479 B2 * | 4/2008 | Van Der Heijden ......... 330/292 |
| 2006/0281426 A1 | 12/2006 | Galan |

* cited by examiner

*Primary Examiner*—Robert Pascal
*Assistant Examiner*—Hieu P Nguyen
(74) *Attorney, Agent, or Firm*—Blakely Sokoloff Taylor & Zafman LLP (57) ABSTRACT

A low-noise amplifier, that utilizes multiple monolithic transformer magnetic feedback to simultaneously neutralize the gate-drain overlap capacitance of the amplifying transistor and achieve high gain at high frequencies when driving an on-chip capacitance, is shown. The multiple transformer topology permits negative and positive feedback to be applied constructively, allowing for a stable design with adequate gain and large reverse isolation without Noise Figure degradation.

27 Claims, 6 Drawing Sheets

| TRIPLE TRANSFORMER PERFORMANCE SUMMARY ||
|---|---|
| Parameter | Quantity |
| Frequency | 5.5 GHz |
| Degeneration inductor ($L_1$) | 0.93 nH |
| Load inductor ($L_2$) | 1.63 nH |
| Compensating circuit inductor ($L_3$) | 1.74 nH |
| Coupling coefficients ($k_{13}, k_{23}, k_{12}$) | 0.3, 0.75, 0.29 |
| Quality factors ($Q_1, Q_2, Q_3$) | 11, 15, 10 |
| Phase imbalance ($L_1, L_2, L_3$) (deg) | 0.7, 0.7, 0.7 |

FIG. 9

| DIFFERENTIAL LNA PERFORMANCE SUMMARY ||
|---|---|
| Parameter | Quantity |
| Frequency | 5.5 GHz |
| LNA Gain | 17.2 dB |
| Noise Figure | 1.6 dB |
| Maximum IIP3* | +13 dBm |
| 3 dB Bandwidth | 1.4 GHz |
| Supply Voltage | 1 V |
| Power Dissipation | 24.8 mW |
| VWSR range (<2) | 650 MHz |
| Compensating stage power consumption | 2.5 mW |
| Gain tuning range ($V_{tune}$ 0.3 V – 0.8 V) | 15.3 dB – 18.9 dB |
| Reverse Isolation | -23 dB |
| IIP3 deterioration ($V_{optimum} \pm 10\%$) | 6 dBm, 6.6 dBm |
| LNA sensitivity to $V_{tune}$ (Gain = 17.5 dB, Temp -40 °C – 100 °C) | 380 mV – 580 mV |
| LNA sensitivity to $V_{tune}$ (Gain = 17.5 dB, VDD ± 20%) | 350 mV – 620 mV |
| Technology | CMOS 0.13-$\mu$m |

*: through optimum gate biasing

FIG. 10

LOW-NOISE AMPLIFIERS

CROSS-REFERENCE TO RELATED APPLICATION

This application claims the benefit of U.S. Provisional Patent Application No. 60/802,106 filed May 22, 2006.

BACKGROUND OF THE INVENTION

1. Field of the Invention

The present invention relates generally to low-noise amplifiers and more specifically to low-noise amplifiers having a high gain at high frequencies using magnetic feedback loops.

2. Prior Art

Technology advances in CMOS processes lead to nanometer (nm) scale transistor structures, suitable for high frequency operation. This facilitates the implementation of Systems on Chip (SoC) with numerous advantages regarding size, cost, and package. In addition, design in nm-scale allows for the supply voltage of the digital circuitry to be reduced to or below 1 V. On the other hand, shrinking of the supply voltage imposes many challenges in the design of the analog part of the system. In integrated low-noise amplifier (LNA) design, classical topologies, including the vastly used cascode topology, are impractical when the lowest possible supply voltage is desired. It is thus imperative for new design topologies to be introduced.

Figure 1:
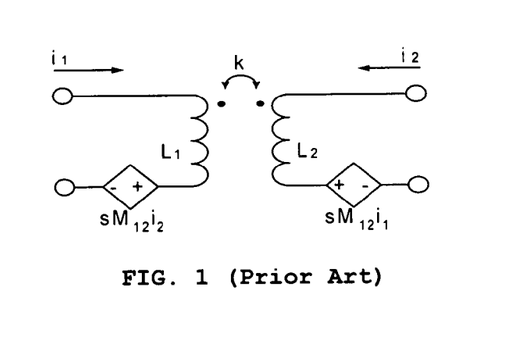
FIG. 1 is a schematic diagram of the application of feedback through a transformer (prior art).
Figure 2:
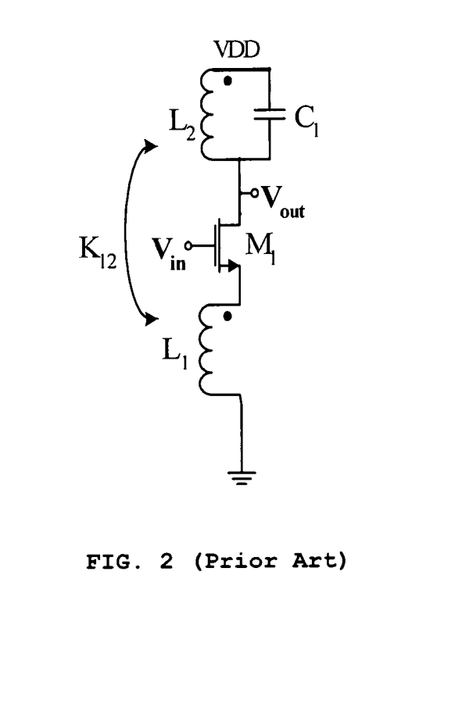
FIG. 2 is a schematic diagram of single transformer LNA (prior art).
Figure 3:
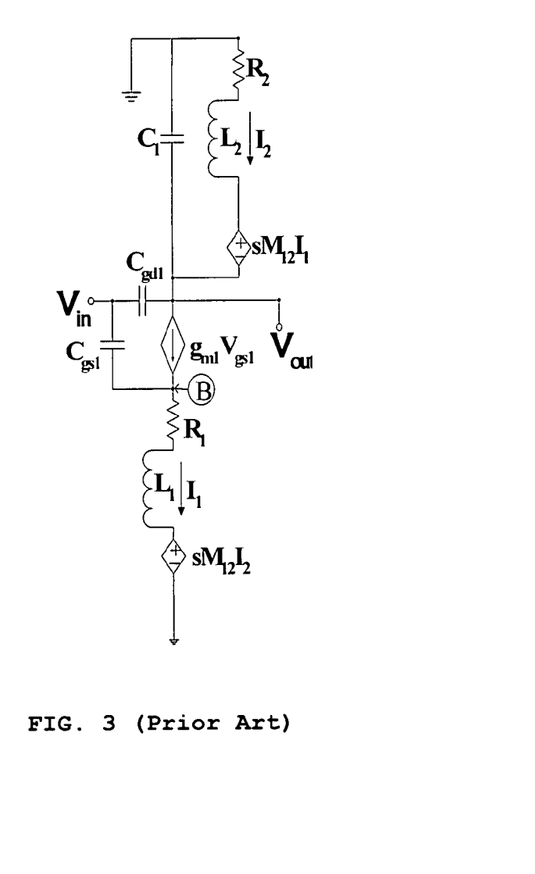
FIG. 3 is an equivalent small signal model of the single transformer LNA (prior art).

Single transistor LNAs that successfully use magnetic negative feedback for MOS gate-drain capacitance ($C_{gd}$) neutralization are known in the art. This ensures high reverse isolation at the cost of reduced gain. However, the low output impedance of the amplifier is not optimal for driving large capacitive on-chip loads. Transformers can be used to provide magnetic feedback that can be modeled as shown in FIG. 1. The nature of the feedback depends on the direction of the currents $I_1$ and $I_2$. In FIG. 1, the transformer provides positive feedback at the input. In this notation, M is the mutual inductance and equals to $M=k\sqrt{L_1 L_2}$, where k is the coupling coefficient. A single transformer LNA is depicted in FIG. 2, whereas in FIG. 3 the corresponding small signal model is presented. The topology is designed to provide negative feedback, represented by the coupling coefficient $k_{12}$, in order to neutralize the capacitance $C_{gd}$ of the transistor and thus increase the reverse isolation of the topology. The transistor $M_1$ is the amplifying transistor, while inductors $L_1$ and $L_2$ are the degeneration and load inductors, respectively. The capacitance $C_1$ represents the equivalent load of the mixer input stage that typically follows the LNA.

It would therefore be advantageous to provide a LNA that overcomes the deficiencies of prior art solutions. Specifically, such a LNA should provide high gain at high frequencies, achieve a large reverse isolation, enable operation at low voltage levels, and be capable of driving large capacitive on-chip loads. It would be further advantageous if the proposed solution overcomes the strict requirements on mutual inductance coefficients and individual inductors present in prior art solutions.

BRIEF DESCRIPTION OF THE DRAWINGS

Salient, exemplary and non-limiting features of the disclosed teachings include but are not limited to.

DETAILED DESCRIPTION OF THE PREFERRED EMBODIMENTS

A low-noise amplifier that utilizes multiple monolithic transformer magnetic feedback to simultaneously neutralize the gate-drain overlap capacitance of the amplifying transistor and achieve high gain at high frequencies when driving an on-chip capacitance is shown. A multiple transformer topology permits negative and positive feedback to be applied constructively, allowing for a stable design with adequate gain and large reverse isolation without Noise Figure degradation. The proposed LNA employs multiple inductive transformer feedback to introduce negative and positive feedback at specific nodes of the topology. This permits both gain and reverse isolation to be set at high values and be almost independent of each other. This technique eliminates the need for a cascode transistor and, therefore, low voltage operation is achievable. The use of multiple feedbacks relaxes the values of the inductor coupling coefficients and offers design flexibility regarding the values of the individual inductors.

The proposed multiple transformers feedback scheme makes the topology inherently suitable for high gain operation at high frequencies where the value of the load inductor needs to be kept small. This is the case in the presence of a large capacitive load introduced by the mixer input stage following the LNA. High gain and large output impedance is achieved with minimal effect on the amplifier stability since the positive feedback loops incorporate an additional high frequency stabilization method while the amount of positive feedback is controllable. The topology allows for the mixer input stage to be independently optimized.

As noted above, the single transistor LNA topology shown in FIG. 2, achieves high reverse isolation at the cost of reduced gain. Furthermore, the gain at high frequencies is limited by the value of the (small) load inductor. Moreover, the output impedance of this topology is low and, therefore, not optimal for on-chip operation. These problems are eliminated with the proposed LNA, presented in FIG. 4, where the inductors are in a triple transformer configuration. Transistor $M_1$ is the amplifying transistor, inductors $L_1$ and $L_2$ are the degeneration and load inductors, respectively, and $C_1$ represents the equivalent load of the mixer input stage. Inductor $L_3$, capacitance $C_2$ and transistors $M_2$ and $M_3$ form a 'compensating' stage. The three-inductor transformer is used to provide feedback, electronically controlled by $V_{tune}$. The coupling factor $k_{23}$ represents positive feedback at the output node that is used to increase the output impedance and thus the gain of the amplifier. Coupling factors $k_{12}$ and $k_{13}$ represent negative feedback at the source of the amplifying transistor, which in combination with the inductive degeneration action of inductor $L_1$ are used to increase the reverse isolation of the amplifier. It should be noted that as positive and negative feedback is applied on different nodes, there is no mutual cancellation. The small signal equivalent model is depicted in FIG. 5, where transistor $M_3$, operating in the triode region of operation, is represented by the variable load $Z_{tune}$.

The transfer function of the TTL (triple transformer LNA) can be found by solving the system of equations in (1), where the parasitic capacitances of transistor $M_2$ are omitted for simplicity reasons. $C_2$ is used for high frequency loop stability and its effect can be neglected in a first order analysis. The additional design parameters are the compensating current $I_3$, and the mutual inductances $M_{13}$ and $M_{23}$.

hancement of the load inductor, and provided that it is a low-Q device, the gain can be enhanced with acceptable bandwidth. The gain enhancement is controlled by the current $I_3$, set by $V_{tune}$ at the gate of transistor $M_3$. It should be noted that using magnetic coupling to enhance the gain has minimal effect on the topology's noise figure. This is due to the fact that the thermal noise of the parasitic resistance $R_3$ of the compensating circuit inductor $L_3$ is coupled to the output with gain<1, since $k_{23}$<1. Given that the value of $R_3$ is inherently small, the effect will be minimal. In addition, as the compensating circuit's current is low (e.g., 1.2 mA) and transistor's $M_3$ (operating in the triode region) channel length is short, the noise contributions of $M_2$ and $M_3$ when coupled to the output are small and thus the compensating stage noise contribution is kept low (~4% of the total output noise).

$$\begin{bmatrix} \frac{g_{m2}}{1+g_{m2}Z_{tune}} & -1 & 0 & 0 & 0 \\ 1 & -sM_{23} & R_2+sL_2 & sM_{12} & 0 \\ s(C_{gd1}+C_1) & 0 & -1 & 0 & -g_{m1} \\ 0 & sM_{13} & -sM_{12} & -(sL_1+R_1) & 1 \\ 0 & 0 & 0 & 1 & g_{m1}+sC_{gs1} \end{bmatrix} \begin{bmatrix} V_{out} \\ I_3 \\ I_2 \\ I_1 \\ V_B \end{bmatrix} = \begin{bmatrix} 0 \\ 0 \\ V_{in}(sC_{gd1}-g_{m1}) \\ 0 \\ V_{in}(g_{m1}+sC_{gs1}) \end{bmatrix} \quad (1)$$

Examination of the response at the output node reveals that the positive feedback effectively increases the output impedance and the gain of the amplifier. For a single transistor amplifier with no feedback, the input impedance of the load resonant tank $L_2//C_1$ can be found from the small signal equivalent circuit in FIG. 3, assuming that the current controlled voltage sources $sM_{12}I_2$ and $sM_{12}I_1$ are zero.

By inspection:

$$\frac{v_{out}}{i_2} = \frac{R_2+sL_2}{s^2L_2C_1+sR_2C_1+1} \quad (2)$$

When feedback is in place, (2) becomes:

$$\frac{v_{out}}{i_2} = \frac{R_2+sL_2}{s^2L_2C_1+s(R_2C_1-\alpha M_{23}I_3+\beta M_{12}I_1)+1} \quad (3a)$$

$$\frac{v_{out}}{i_2} = \frac{R_2+sL_2}{s^2L_2C_1+s(R_2C_1+\gamma M_{12}I_1)+1} \quad (3b)$$

in the cases of the triple transformer LNA (TTL) (equation 3a) and the single transformer LNA (STL) (equation 3b), respectively. In equation 3a, α and β are coefficients relating $I_3$ and $I_1$ with the output voltage. The exact values of α and β can be calculated by solving equation 1. In equation 3b, Y relates $I_1$ with the output voltage.

Examination of the second term in the denominator of the above mentioned equations reveals that the feedback represented by the $\beta M_{12}I_1$ and $YM_{12}I_1$ terms is an unwanted effect. It reduces the quality factor of the load inductor, limiting the gain and the output impedance of the topology and has no contribution to the reverse isolation enhancement. This effect is uncompensated in the single transformer topology. In accordance with the proposed LNA of the invention, the feedback represented by the $-\alpha M_{23}I_3$ term, can be designed to totally cancel $\beta M_{12}I_1$. If necessary, the feedback can be designed so that $\alpha M_{23}I_3 > \beta M_{12}I_1$. This represents Q-en- Examining the voltage at node B of FIG. 3 and FIG. 5, and taking into account the relative phase of the currents, the source of the transistor is at a voltage level $$v_{source} = I_1R_1+I_1sL_1+sM_{12}I_2+sM_{13}I_3 \quad (4a)$$

$$v_{source} = I_1R_1+I_1sL_1+sM_{12}I_2 \quad (4b)$$

for the TTL (equation 4a) and STL (equation 4b), respectively. This voltage is increased with respect to the voltage of inductive degeneration alone, which represents negative feedback. This feedback can be used for $C_{gd}$ neutralization and reverse isolation enhancement. In the TTL, the required feedback is attained by the combined effect of two feedback loops ($sM_{12}I_2$ and $sM_{13}I_3$), allowing the designer to optimize the coupling coefficients and the compensating current $I_3$ in order to simultaneously satisfy the gain specifications of the design.

Figure 4:
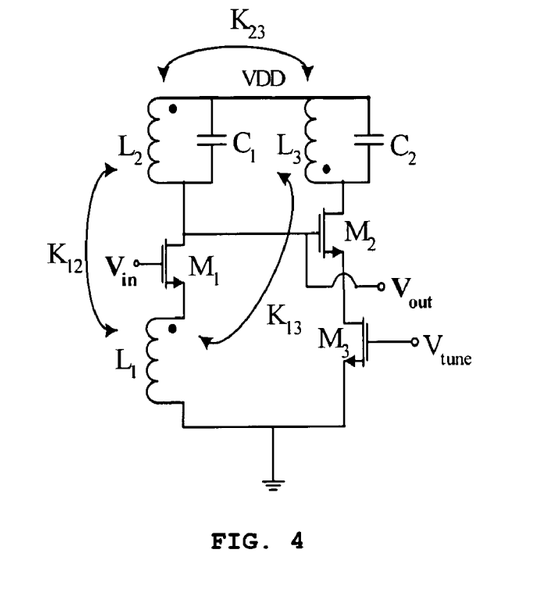
FIG. 4 is a schematic diagram of a LNA in accordance with the disclosed invention.
Figure 5:
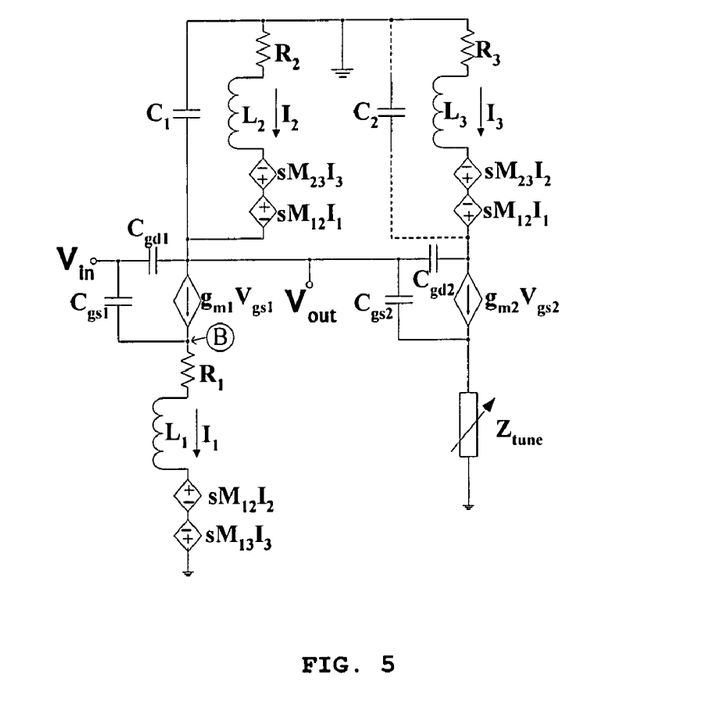
FIG. 5 is an equivalent small signal model of the LNA in accordance with the disclosed invention.

The main advantage of the proposed LNA of FIG. 4 lies on the simultaneous application of positive and negative feedback without mutual cancellation. The technique allows for the gain and the reverse isolation to become almost independent and to be set at high values, as it is evident from equations 3 and 4. This offers an additional degree of freedom with respect to the STL, where gain and reverse isolation are directly related. In addition, the gain is not solely defined by the output impedance of the load inductor, which may be small, but can be increased to the desired level through feedback as demonstrated in equation 3. This is an advantage compared to the STL, where the gain is limited by the inductive load and is inherently low at high frequencies, restricting the applicability of the topology.

In order to ensure the stability of the circuit, from equation 3, it is determined that the circuit is stable when $$\alpha M_{23}I_3 \leq R_2C_1+\beta M_{12}I_1 \quad (5)$$

Since the Q-enhancement, achieved when $\alpha M_{23}I_3 > \beta M_{12}I_1$, is electronically tunable, it is possible to satisfy equation 5 under component parameter, supply voltage, and temperature variations. In order to take into account the non-linear nature and the frequency dependence of the feedback loop, an additional stabilization method may be adopted. The technique relies on resonating the inductor of the compensating circuit with a parallel capacitor $C_2$, as shown in FIG. 5. This is done in order to reduce the small signal compensating current flowing into inductor $L_3$ at high frequencies, in order to reduce the feedback at these frequencies and thus stabilize the circuit. The stabilization method has an effect on the $L_2$ resonating frequency, which is given by $$f_{res} \approx \frac{1}{\sqrt{L_1(C_1 + C_2) + C_1 C_2 R_1 R_2}} \quad (6)$$

If the capacitance $C_1$, which represents the mixer load, has a large value and resonance cannot be achieved, alternative stabilization techniques may be used, typically at the cost of increased area, since an additional inductor is necessary.

Figure 6:
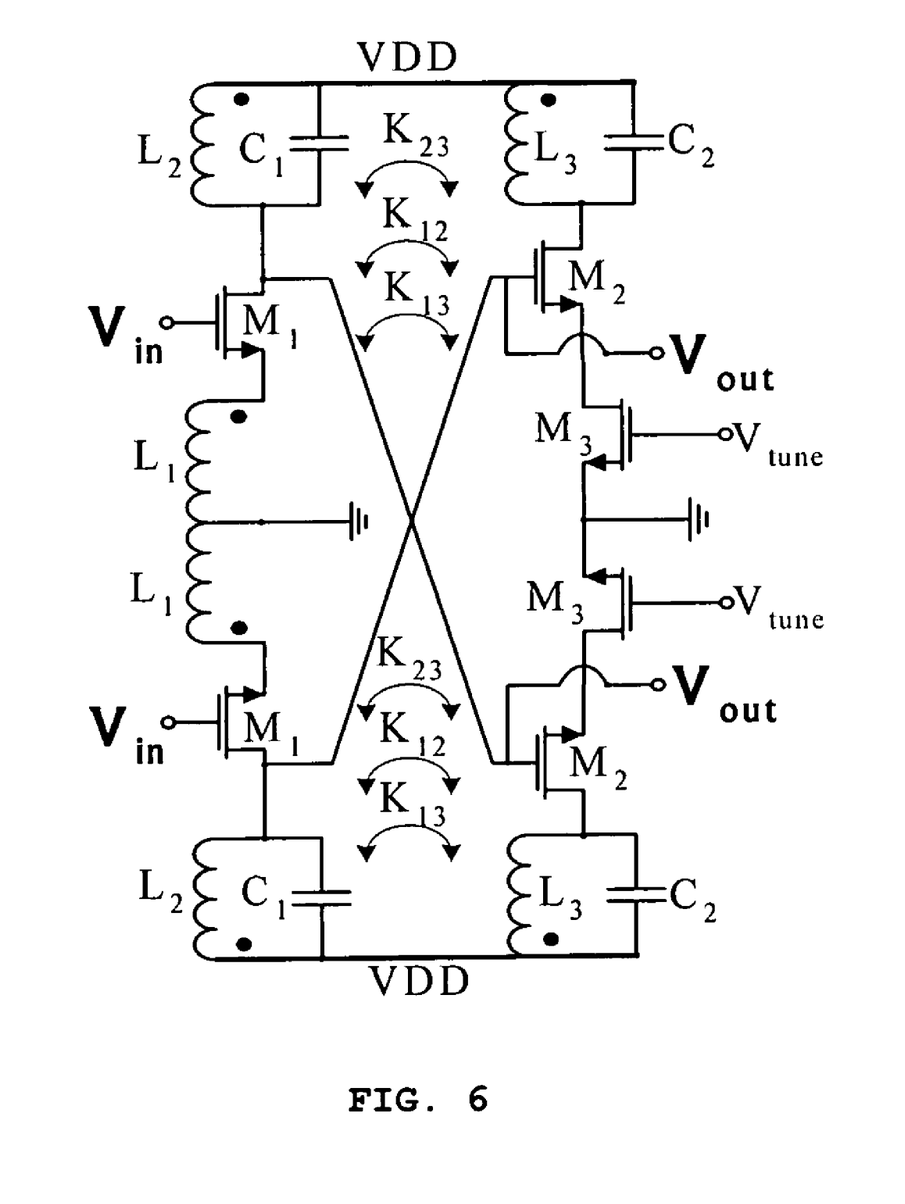
FIG. 6 is a schematic diagram of a differential LNA in accordance with the disclosed invention.

The design can be configured to operate in differential mode as it is depicted in FIG. 6. The output nodes of the two amplifier elements of the LNAs are cross-coupled, and the compensating circuit inductor wiring is reversed. Using this configuration, amplitude imbalances at the input nodes of the circuit can be compensated. This is because the amount of gain enhancement in the high-amplitude output node is set by the signal in the low-amplitude input, resulting in reduced enhancement from the compensating circuit and vice versa. As the overall gain of the LNA is the combined effect of the forward gain and the gain contribution due to feedback, the individual gains tend to equalize. In the differential STL, the amplifiers are not interacting and the amplitude imbalance will be amplified by the LNA gain.

To demonstrate the advantages of the disclosed invention, the designs of the STL from FIG. 2 and the TTL from FIG. 4 were simulated using device files from a 0.13-μm CMOS 8-metal technology. A full set of typical QFN package parasitics was used, while the transformer parameters were extracted using EM software. The circuits were loaded using extracted parameters of a mixer designed for WLAN applications. The results presented refer to conjugate matched designs to a 50Ω input. The amplifying transistor, the load and degeneration inductor, and the amplifying stage bias current are the same in both cases. Only the coupling coefficients and the compensating current $I_3$ are treated as design variables.

Figure 7:
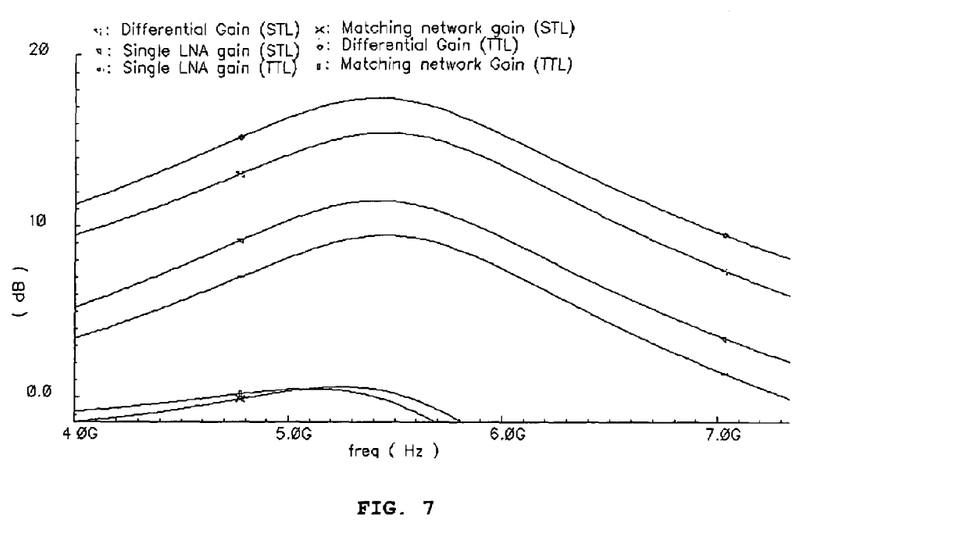
FIG. 7 shows gain simulation results of a single transformer LNA and the LNA in accordance with the disclosed invention.
Figure 8:
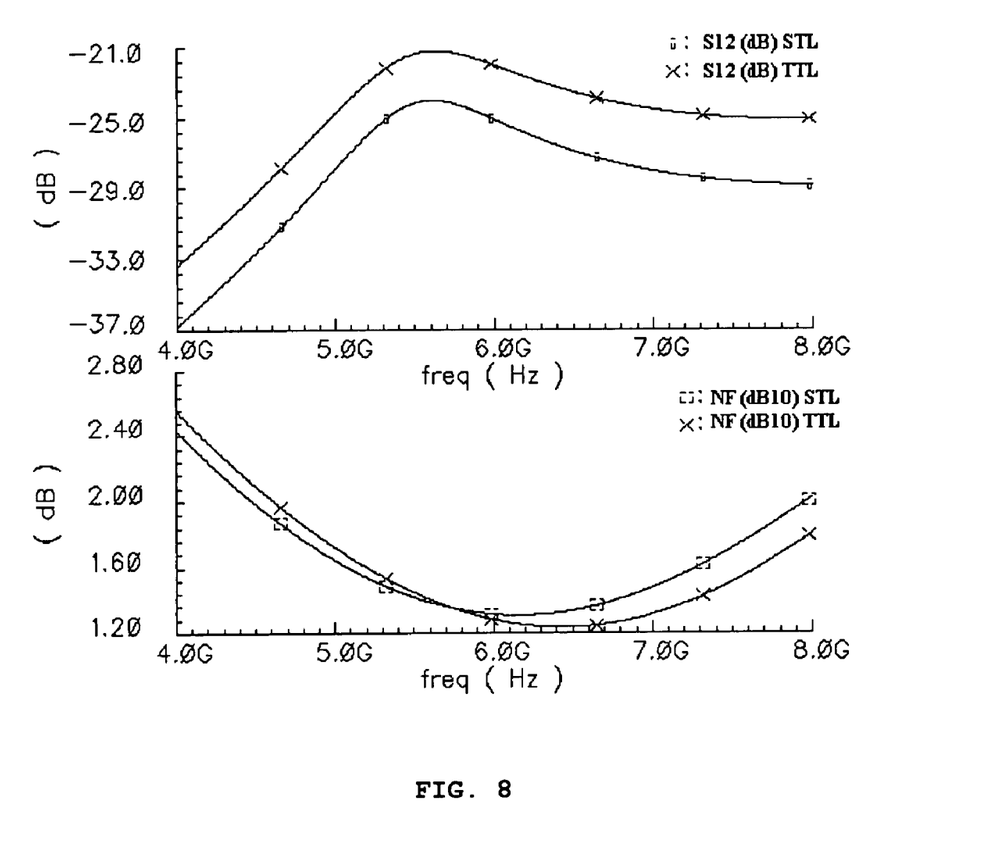
FIG. 8 shows reverse isolation and noise figure response simulation results of a single transformer LNA and the LNA in accordance with the disclosed invention.

FIG. 7 illustrates a comparison simulation of the TTL and the STL gain response, in the case where the amplifiers achieve the same reverse isolation. The TTL gain enhancement is 2 dB, while the matching network gain is 1 dB less. If required, the compensating stage may provide an extra 1.5 dB gain, with 1 dB reverse isolation deterioration. In the same figure, a comparison of the reverse isolation and noise figure (NF) of the STL and TTL is presented, under the same gain conditions.

Figure 10:
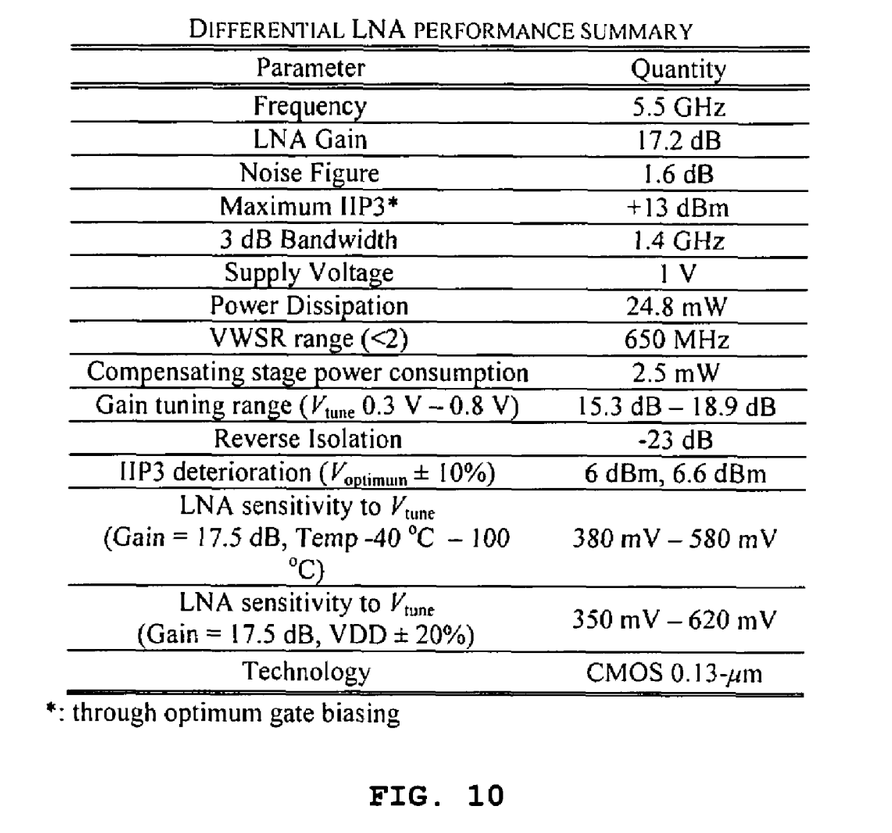
FIG. 10 is table summarizing a typical performance of a differential LNA in accordance with the disclosed invention.

The TTL reverse isolation performance is better by 3.5 dB, and the NF deterioration is minor, (0.06 dB) due to the reasons explained above. In FIG. 10, Table I, the simulated performance of the triple transformer LNA is summarized.

Figure 9:
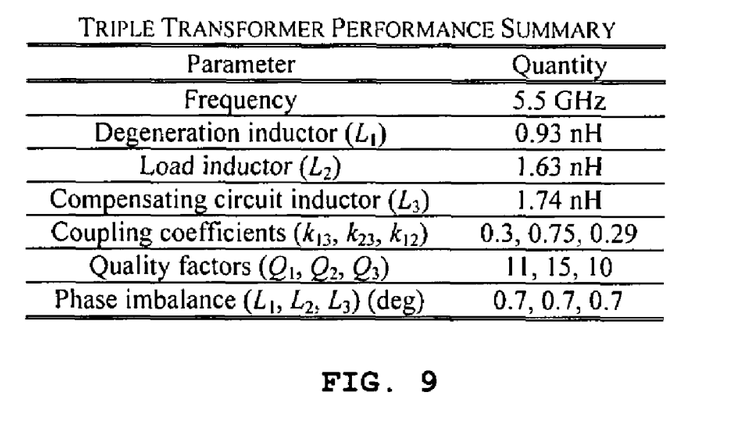
FIG. 9 is a table summarizing the performance of the triple transformer topology.

In FIG. 9, the simulated parameters of the Differential Triple Transformer are shown. Finally, in FIG. 10, a summary of the transformer performance is reported. The quoted IIP3 value (+13 dBm) represents the maximum achievable linearity performance of the TTL, when the linearization technique of optimum gate biasing is applied at the amplifying transistor. Since the linearity performance deteriorates away from the optimum bias point, linearity deviation values are quoted in FIG. 10, when the bias point is altered by 20%. It should be noted that achieving the optimum linearity required a 30% increase in power consumption, since the performance regarding the gain, NF and reverse isolation could be achieved with a bias current of 16.7 mA. The gain tuning capability of the LNA can be used to compensate for supply voltage and temperature deviations very effectively, since a tuning range of 270 mV is adequate to keep a constant gain behavior, as shown in FIG. 10. The topology provides adequate driving capability as the output impedance is 156Ω and is degraded by 13% in a 1 GHz range around the resonance frequency.

In preferred embodiments, the transformers are fabricated on chip, and may be coreless or with core as is well known in the art. Also the embodiments disclosed herein have been disclosed with respect to the use of CMOS devices. While CMOS devices are preferred, other transistor types may be used, such as, by way of example, bipolar transistors. Any such transistors may be characterized by the conduction between first and second terminals being controlled by the voltage between the first terminal and a control terminal.

In summary, the novel low-voltage LNA topology disclosed herein utilizes multiple magnetic feedbacks and is suitable for driving large on-chip capacitances with high reverse isolation. It compensates the Q-reduction of the load inductor that is limiting the gain of the STL, and offers the option of increasing the gain of an LNA with a small inductive load at the desired value through feedback in order to achieve large gain at high frequencies. The gain enhancement has minimal effect on the reverse isolation, due to the combined effect of two feedback loops, thus relaxing the coupling coefficient requirements and allowing for an area efficient design. Using two loops for negative feedback offers design flexibility with respect to the STL, where a high coupling factor is demanded, limiting both the relative and absolute values of the load and degeneration inductors. The LNA provides high linearity, and as the mixer input stage can be optimized independently, it is easier to achieve the overall receiver linearity specification.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A low noise amplifier (LNA) comprising:
    first and second power supply terminals;
    a first transistor having first and second terminals and a control terminal, the conduction between first and second terminals being controlled by the voltage between the first terminal and the control terminal, the first transistor having its control terminal coupled as an LNA input;
    a first inductor coupled between the first terminal of the first transistor and the first power supply terminal;
    a second inductor coupled between the second terminal of the first transistor and the second power supply terminal, the first and second inductors having a first magnetic coupling;
    a compensation circuit coupled to the second terminal of the first transistor, the compensation circuit having a second magnetic coupling to the first inductor and a third magnetic coupling to the second inductor;
    an output of the LNA being coupled to the second terminal of the first transistor;
    the magnetic coupling providing both a positive feedback and a negative feedback that do not cancel each other.

2. The LNA of claim 1, wherein the compensation circuit comprises:
a second and a third transistors, each also having first and second terminals and a control terminal, the conduction between first and second terminals being controlled by the voltage between the first terminal and the control terminal;
a third inductor coupled between the second power supply terminal and the second terminal of the second transistor;
the first terminal of the second transistor being coupled to the second terminal of the third transistor and the control terminal of the second transistor being coupled to the second terminal of the first transistor;
the first terminal of the third transistor being coupled to the first power supply terminal;
the control terminal of the third transistor being coupled to a feedback control input.

3. The LNA of claim 2, wherein the third transistor operates in the triode region.

4. The LNA of claim 2, further comprising:
a capacitor coupled in parallel with the third inductor.

5. The LNA of claim 1, wherein the first magnetic coupling and the second magnetic coupling provide a negative feedback at the control terminal of the first transistor.

6. The LNA of claim 5, wherein the reverse isolation of the LNA is increased by the combination of the negative feedback and the degradation of action of the first inductor.

7. The LNA of claim 1, wherein the coupling factor of the third magnetic coupling is less than one.

8. The LNA of claim 1, wherein the gain of the LNA and the reverse isolation of the LNA are essentially independent, thereby enabling the setting of each of the gain and the reverse isolation to high values.

9. The LNA of claim 1, wherein the first inductor and the second inductor comprise a single transformer.

10. The LNA of claim 1, further comprising:
a capacitor coupled in parallel with the second inductor.

11. A method of achieving an essentially independent gain of a low-noise amplifier (LNA) and a reverse isolation of the LNA, the method comprising:
creating a first magnetic coupling between a first inductor and a second inductor of the amplifier stage of the LNA; and,
enabling a compensation circuit to provide a second magnetic coupling to the first inductor and a third magnetic coupling to the second inductor, the second magnetic coupling and the third magnetic coupling enabled to cancel the undesirable effects of the first magnetic coupling.

12. The method of claim 11, wherein the compensation circuit comprises a third inductor.

13. The method of claim 12, further comprising:
coupling a capacitor in parallel to the third inductor.

14. The method of claim 11, further comprising:
causing the first inductor and the second inductor to form a transformer.

15. The method of claim 11, further comprising:
tuning the LNA by applying a control signal to the compensation circuit.

16. The method of claim 11, further comprising:
causing the coupling factor of the third magnetic coupling to be smaller than one.

17. The method of claim 11, further comprising:
coupling a capacitor in parallel to the second inductor.

18. A low noise differential amplifier (LNDA) comprising:
first and second power supply terminals;
first and second low noise amplifiers (LNA), each having:
a first transistor having first and second terminals and a control terminal, the conduction between first and second terminals being controlled by the voltage between the first terminal and the control terminal, the first transistor having its control terminal coupled as a respective LNDA input;
a first inductor coupled between the first terminal of the first transistor and the first power supply terminal;
a second inductor coupled between the second terminal of the first transistor and the second power supply terminal, the first and second inductors having a first magnetic coupling;
a first compensation circuit being coupled to the second terminal of the first transistor of the second LNA, the first compensation circuit having a second magnetic coupling to the first inductor of the first LNA and a third magnetic coupling to the second inductor of the first LNA;
a second compensation circuit being coupled to the second terminal of the first transistor of the first LNA, the second compensation circuit having a second magnetic coupling to the first inductor of the second LNA and a third magnetic coupling to the second inductor of the second LNA;
each differential output of the LNDA being coupled to the second terminal of the first transistor of a respective LNA;
the magnetic coupling providing both a positive feedback and a negative feedback that do not cancel each other.

19. The LNDA of claim 18, wherein each of the compensation circuits comprise:
second and third transistors, each having first and second terminals and a control terminal, the conduction between first and second terminals being controlled by the voltage between the first terminal and the control terminal;
a third inductor coupled between the second power supply terminal and the second terminal of the second transistor;
the first terminal of the second transistor being coupled to the second terminal of the third transistor and the control terminal of the second transistor being coupled to the second terminal of the first transistor;
the first terminal of the third transistor being coupled to the first power supply terminal;
the control terminal of the third transistor being coupled to a feedback control input.

20. The LNDA of claim 19, wherein the third transistors operate in the triode region.

21. The LNDA of claim 19, further comprising:
a capacitor coupled in parallel with the third inductor in each of the compensation circuits.

22. The LNDA of claim 19, further comprising:
a capacitor coupled in parallel with the second inductor in each of the compensation circuits.

23. The LNDA of claim 18, wherein the first magnetic couplings and the second magnetic couplings provide negative feedback at the first terminals of the first transistors in each LNA.

24. The LNDA of claim 23, wherein the reverse isolation of each of the low noise amplifiers is increased by the combination of the negative feedback and the degradation of action of the first inductor.

25. The LNDA of claim 18, wherein the coupling factors of the third magnetic couplings is smaller than one.

26. The LNDA of claim 18, wherein the gain of each of the low noise amplifiers and the reverse isolation of each of the low noise amplifiers are essentially independent, thereby enabling the setting of each of the gain and the reverse isolation to high values.

27. The LNDA of claim 18, wherein the first inductor and the second inductor comprise a single transformer.

* * * * *